United States Patent [19]

Cowart et al.

[11] Patent Number: 5,519,331
[45] Date of Patent: May 21, 1996

[54] REMOVABLE BIASING BOARD FOR AUTOMATED TESTING OF INTEGRATED CIRCUITS

[75] Inventors: Lawrence R. Cowart, Fremont; James E. Spooner, Manteca, both of Calif.

[73] Assignee: LSI Logic Corporation, Milpitas, Calif.

[21] Appl. No.: 337,928

[22] Filed: Nov. 10, 1994

[51] Int. Cl.[6] .................................................. G01R 31/00
[52] U.S. Cl. ........................................ 324/755; 324/765
[58] Field of Search ............................... 324/72.5, 73.1, 324/158.1, 761, 754, 760, 755, 765; 439/482, 45, 60, 66, 70

[56] References Cited

U.S. PATENT DOCUMENTS 4,700,132  10/1987  Yarbrough et al. ................... 324/761
4,782,289  11/1988  Schwar et al. ....................... 324/761
5,126,657   6/1992  Nelson ................................. 324/761
5,257,165  10/1993  Chiang ................................... 439/45
5,289,118   2/1994  Crisafulli ............................. 324/761

*Primary Examiner*—Vinh P. Nguyen
*Attorney, Agent, or Firm*—Katz & Cotton

[57] ABSTRACT

A "personality" card (bias adapter board) is employed to program power supply connections in a DUT (Device Under Test) fixture in an automated test environment. The DUT fixture is designed to provide access to power supply voltages from the automated test equipment (ATE) and to selected (configurable) pins of the device under test. Specific connections are established between designated power supply pins of the DUT and the ATE via the bias adapter card, thereby eliminating the need for a separate, expensive DUT board for each different DUT.

7 Claims, 4 Drawing Sheets

REMOVABLE BIASING BOARD FOR AUTOMATED TESTING OF INTEGRATED CIRCUITS

TECHNICAL FIELD OF THE INVENTION

The invention relates to automated testing of integrated circuits using Automated Test Equipment (ATE), and more particularly to test fixtures used in conjunction with such testing.

BACKGROUND OF THE INVENTION

Due to the high degree of complexity and high density of modern integrated circuitry, manufacturers of integrated circuits (ICs) typically use highly-sophisticated Automated Test Equipment (ATE) to test integrated circuits, to ensure that they perform as designed (e.g., to specification). Some high-volume integrated circuit users also utilize ATEs to verify the function of integrated circuits (usually on a sampled basis). Without using an ATE, or the like, it would be virtually impossible to achieve high confidence levels with respect to integrated circuit functionality and reliability.

Automated test equipment (ATE) provides the ability to generate test signal sequences on a large number of pins of an integrated circuit device under test (DUT), in some cases simultaneously. Unlike ordinary digital equipment, however, ATE is capable of tightly controlling signal timing and voltage characteristics to within a small margin of error. Timing relationships between signals, rise times, fall times, etc., provided by the ATE are all well defined at the pins of the DUT. Additionally, the ATE is capable of making accurate measurements of voltage levels and timing of signals emanating from the DUT in response to the signal sequences (e.g., test vectors). These capabilities are provided at very high speed under the control of a pre-defined test program. Further, most automated test equipment include programmable voltage sources for applying to the DUT. These voltages are sometimes referred to as "bias" voltages or "bias" signals, and are generally used to supply power to the DUT via its power and ground pins.

For analog integrated circuit functions, some automated test equipment includes high-speed waveform signal generators, the outputs of which can be applied to analog function pins of the DUT. Similarly, such analog capability usually includes some sort of high-speed voltage sampling capability. Sometimes, these analog capabilities are applied to digital functions as a part of a test in order to ensure compliance of a DUT with pre-specified signal threshold levels, hysteresis, etc.

FIG. 1a is a block diagram of a typical automated tester (ATE) for integrated circuits. The ATE 100 comprises a test sequencer 130 which operates under the control of a stored test program 140 to control programmable pin drivers/monitors 110 and programmable power supplies (voltage sources) 120. The programmable power supplies 120 are controlled by the program 140 to generate suitable power supply voltages to be applied to a DUT 170. The specific power supply voltages are selected to suit specific test requirements. For example, it might be desirable to test a DUT 170, e.g., a CMOS (Complementary Metal Oxide Semiconductor) IC, at minimum, nominal, and maximum power supply voltages to ensure compliance of the DUT with specified performance parameters at those voltages. Accordingly, three sets of test signal sequences would be generated under control of the program 140, each sequence altering the power supply voltages to reflect minimum, nominal, or maximum rated power supply specifications for the DUT 170. The programmable pin drivers/monitors 110 would be controlled by the program 140 (via the test sequencer 130) to generate high-speed digital test signals (vectors) to be applied to the DUT 170 and to monitor and measure various parameters of specific signals generated by the DUT 170 in response to the test signals. (ATE pin drivers can usually also be set to a high-impedance state, essentially leaving the associated DUT pin "unconnected").

The output signals (and monitor inputs) of the programmable pin drivers/monitors 110 and the outputs of the programmable power supplies 120 are provided to the DUT 170 via a DUT interface board 160 connected to a test interface connector 150 on the ATE 100. The signals and supply voltages are routed through the test interface connector 150 via contacts or connections on the DUT board 160 to pins of a DUT socket or connector 165 mounted to the DUT board 160. The DUT 170 "plugs into" the test interface connector 165. (The term "plugs into" is used loosely here, since the DUT connector 165 is usually a specialized test connector, such as a "zero-insertion-force" connector, designed to minimize the mechanical stress placed upon the pins or contacts of the DUT 170).

Referring to FIG. 1b, the DUT board 160, is essentially a test fixture designed to adapt the DUT 170 to the test interface connector 150 of the ATE 100. Typically, the DUT board 160 is a very thick, rigid printed circuit board with contact pads on a bottom side thereof (not shown) to make contact with spring-loaded contactors in the test interface connector 150. Often, the DUT board is clamped to the test interface connector 150 via a camlocking arrangement (not shown). Signal traces 162 (a representative few shown) on the top of the DUT board connect the contact pads (on the bottom of the DUT board) to the DUT connector 165.

Although most modern integrated circuits are assembled into one of a relatively small number of different package types, there is little standardization of pinouts on these packages, particularly with respect to power supply connections. Most PLCC (plastic leaded chip carrier), PQFP (plastic quad flat pack), and PGA devices, particularly those with large numbers of "pins" (e.g., 100 or more), will have several "pins" dedicated to each of the power supply voltages. Unfortunately (e.g., for testing purposes), the selection of these power supply pins is usually different for different ICs, despite the use of identical package types. Consequently, it has been necessary to provide a different DUT board (e.g., 160) for each different IC. Each different DUT board will have power supply signals (bias signals) routed to different pins of the DUT connector, as required by the specific IC to be tested.

There is considerably greater flexibility with respect to the programmable pin drivers/monitors (e.g., 120) since their operation is governed by a test program. A specified test signal sequence can be routed to any connected pin (other than the power supply pins, of course) simply by specifying the appropriate pin driver/monitor in the test program (e.g., 140).

DUT boards must generally be built to relatively tight mechanical tolerances and must use relatively expensive, high-quality materials to ensure good contact between the various connections, and to ensure long service life. As a result, a DUT board can sometimes cost as much as $4000.00. This is particularly troublesome to ASIC (Application Specific Integrated Circuit) vendors, for whom practically every customer has a different IC design. As a result, each IC for each customer must have a custom-built DUT board. These DUT boards add expense to the cost of developing the IC, represent a significant storage problem (these boards are relatively large, and must be kept on hand for subsequent production runs of the customers ICs) and can potentially delay delivery of initial quantities of ICs to the customer (due to the fabrication time required for the DUT board).

Evidently, it would be highly advantageous to provide some means of eliminating or minimizing the delay, storage requirements, and expense associated with the design and fabrication of DUT boards.

DISCLOSURE OF THE INVENTION

It is therefore an object of the present invention to provide a technique for minimizing cost associated with the development of DUT boards for automated test equipment.

It is a further object of the present invention to provide a technique for minimizing delay associated with the fabrication of DUT boards for automated test equipment.

It is a further object of the present invention to provide a technique for accommodating a variety of DUTs with different power supply pin connections on a single DUT board.

It is a further object of the present invention to provide a simple, inexpensive technique for reconfiguring DUT power supply connections on a DUT board.

It is a further object of the present invention to reduce the amount of storage space required for ATE DUT boards when a large number of different ICs are to be accommodated.

According to the invention, a DUT base board is designed to accept a DUT connector (socket), into which a DUT is installed for test. The DUT base board may installs into the ATE (via a test interface connection) in a conventional manner. The DUT base board routes power supply signals to specific locations on the DUT base board assembly whereby a separate bias adapter can gain access to the power supply signals. Further, means are provided for the separate bias adapter to gain electrical access to pins of the DUT connector. The bias adapter routes the power supply signals to specific pins of the DUT connector which are designated as power supply pins for a specific integrated circuit.

According to an aspect of the invention, a different bias adapter card is employed for each different IC to be tested (DUT).

In one embodiment of the invention, a receptacle is employed in which receptacle pins (elongated conductive pins which have a pin-receiving receptacle at one end) are installed. Pin portions of the s receptacle pins extend completely through the DUT base board. Both signals and power supply voltages are carried by the receptacle pins. The DUT connector (Socket) plugs into selected ones of the receptacle pins (those not connected to power supply voltages). The extension of the receptacle pins through the DUT base board provides the means by which the bias adapter gains access to the power supply voltages and pins of the DUT connector (socket).

According to an aspect of the invention, the bias adapter is fitted with contactors to make contact with the power supply connected receptacle pins and with selected ones of the receptacle pins which connect to the DUT connector (socket). The selected ones of the DUT connector pins are those which are designated as power supply pins for a specific IC type. Electrical connections are established on the bias adapter between appropriate contactors to connect power supply voltage to appropriate pins of the DUT connector (socket).

In one embodiment of the invention, a threaded nut is embedded into the receptacle and clearance holes for a screw are provided through the DUT base board and bias adapter. A screw is inserted through the clearance holes and into the threaded nut, and is tightened to clamp the bias adapter to the DUT base board and receptacle.

According to another aspect of the invention, power supply decoupling capacitors can be employed on the bias adapter.

The receptacles, being designed to accept a variety of connectors (sockets) which may accommodate a variety of IC package types. The specific power supply connections for each different IC (DUT) are determined via the installed bias adapter, which essentially "programs" the power supply connections for the DUT. In this manner, virtually any power supply pin configuration can be accommodated by employing a properly configured bias adapter board. It is only necessary to provide as many different DUT base boards (including assembled test receptacle) as are necessary to accommodate all of the different DUT connectors to be employed. Storage requirements are thus minimized by eliminating the need for storage of a much larger custom designed DUT board for every Ic type.

Further, each IC need only have a custom bias adapter board. These boards, which are considerably smaller and simpler than the prior art DUT boards, require little storage space, are relatively inexpensive, and can be assembled from a relatively small number of common blank boards. The commonality between bias adapter boards is defined by the number of different receptacle pin patterns which must be accommodated.

The bias board provides an easy, inexpensive method to provide power and ground connections to a device under test (DUT) using automatic test equipment. When personalizing, or "programming" a bias board, a customer specification is reviewed to determine where power supply connections are needed. The bias board is wired and decoupling caps are added for all power connections. Contactors, such as Augat HolTights (tm) are then installed at each biased pin. The bias board is then inserted and secured with a screw which threads on a nut embedded in the receptacle. By employing a relatively simple bias adapter scheme, potential delays are avoided in the initial production cycle, since no elaborate fabrication techniques are required to adapt an existing DUT fixture to a new IC. Only a new bias adapter card is require.

Other objects, features and advantages of the invention will become apparent in light of the following description thereof.

BRIEF DESCRIPTION OF THE DRAWINGS

FIG. 1b is a view of a prior-art DUT board used in the automated test system of FIG. 1a.

DETAILED DESCRIPTION OF THE INVENTION

Figure 1A:
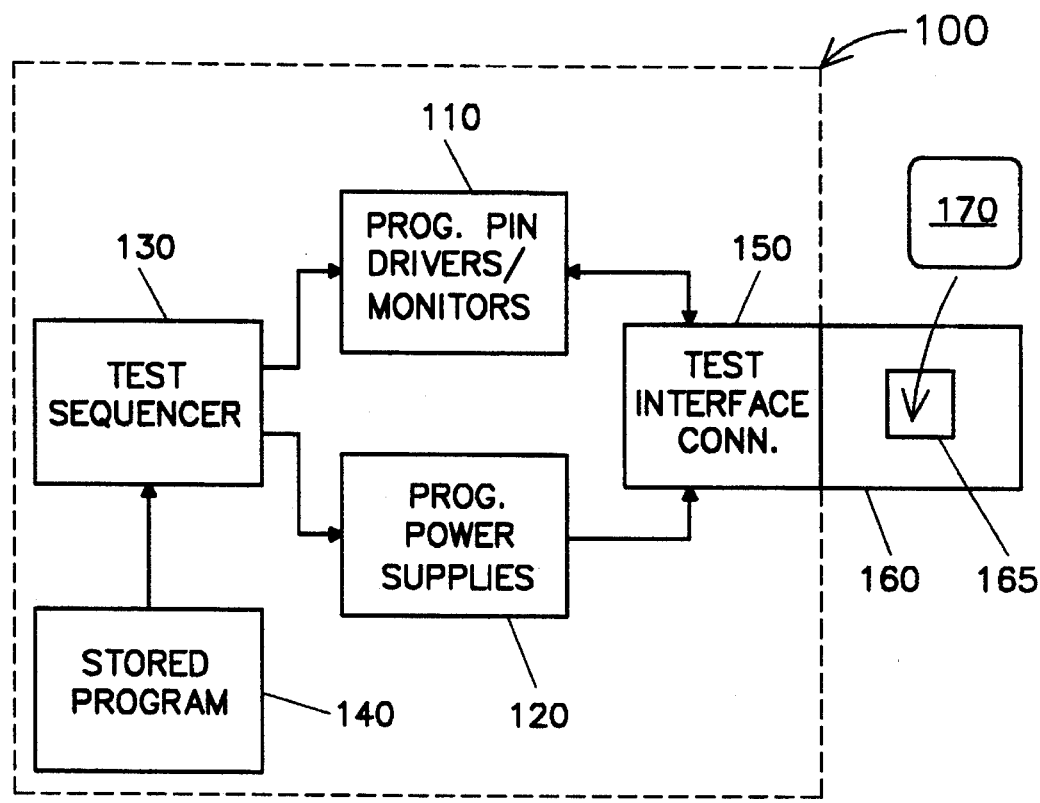
FIG. 1a is a block diagram of a prior art automated test system for testing integrated circuits.
Figure 1B:
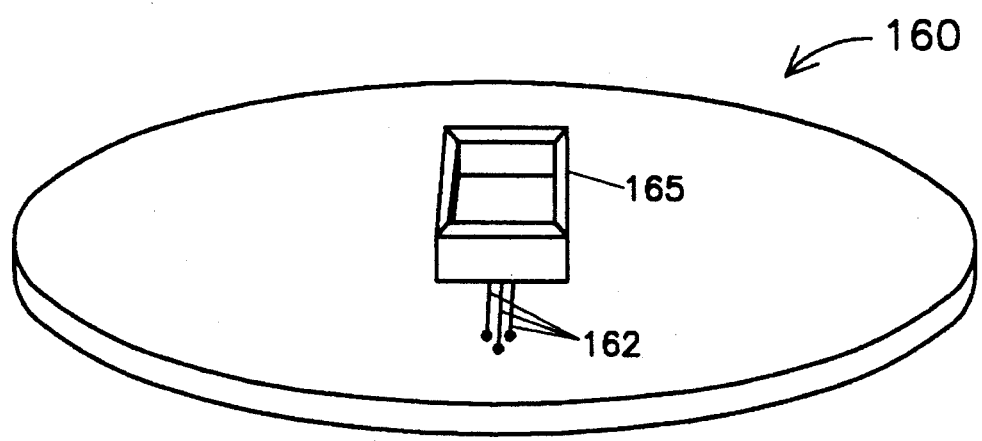

FIGS. 1a and 1b illustrate an automated test environment for testing integrated circuit devices, and have been discussed hereinabove. Generally, it has heretofore been required to fabricate a unique base board for each different integrated circuit device undergoing test, notably with regard to the power supply connections to the device under test (DUT).

Figure 2A:
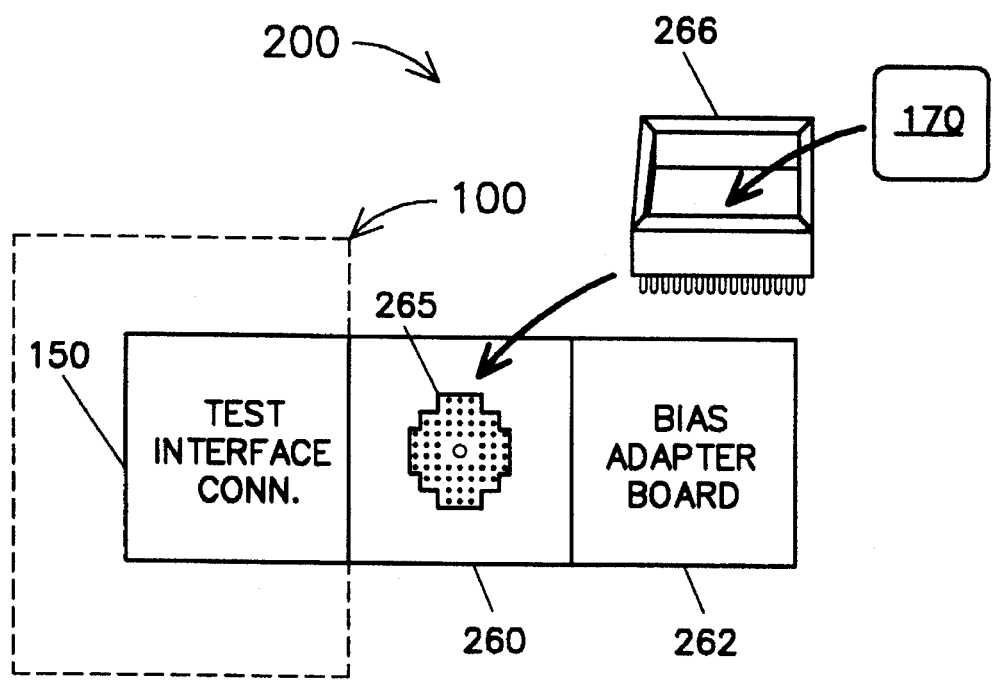
FIG. 2a is a block diagram of an automated test arrangement including a "bias" board, according to the invention.

FIG. 2a is a block diagram of an automated test system 200 embodying the principles of the present inventive technique. The automated test system 200 employs an ATE tester 100 (see, e.g., FIG. 1a) having a test interface connector 150. A modified DUT base board 260 (comparable to interface board 160) and "bias adapter" board 262 (described in greater detail hereinbelow) are connected to the test interface connector. A test receptacle 265 is mounted to the modified DUT base board 260. The test receptacle 265 receives a DUT connector 266 and is connected thereto via, for example, by pin connections on the DUT connector 266 and socket-type connections on the test receptacle 265. One of ordinary skill in the art will immediately recognize that any suitable connection scheme can be employed. The DUT connector 266 receives a DUT 170.

Figure 2B:
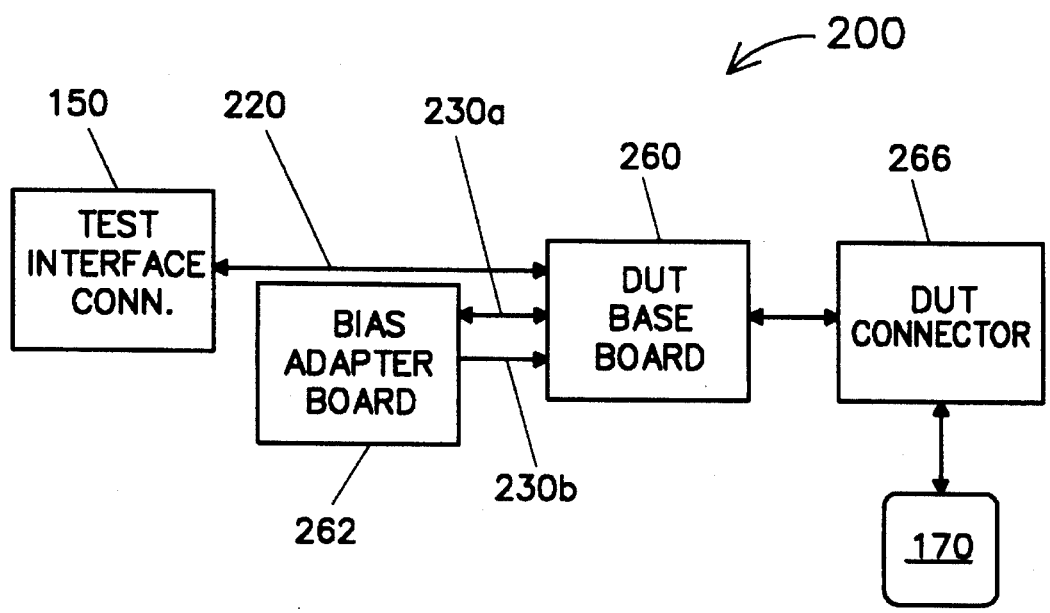
FIG. 2b is a block diagram showing interconnections between a test interface connector, "bias" board, and DUT connector, according to the invention.

FIG. 2b is a more detailed block diagram of a portion of the automated test system 200 showing the path of signal connections between the various components of the inventive ATE test system (fixture). The test interface connector 150 provides a plurality of signals 220, which include driven test signals, monitored "signals, and power supply or "bias" signals to the DUT base board 260. The power supply signals are separately routed (via lines 230) on the DUT base board 260 to by a suitable connection scheme (one such scheme is described in greater detail hereinbelow) to the bias adapter board 262. The bias adapter board 262 configures the power supply connections to the test receptacle 266 by routing the power supply signals back to specific pins of the DUT connector 265 on the DUT board (via lines 230b). In this way, the DUT 170 receives power supply connections to the appropriate pins. Since pin drivers (see, e.g., 110, FIG. 1a and descriptions with respect thereto) can generally be set to a high-impedance state, the power supply connections 230b from the bias adapter board 262 to the DUT connector 266 (via the DUT base board 260) can usually be connected in parallel with a fixed signal connection from the ATE 100 to the same pin on the test receptacle 265. The test program (e.g., 140, FIG. 1a) simply sets the corresponding pin driver (e.g., 110 FIG. 1a) to a high impedance, or undriven, state.

Figure 3A:
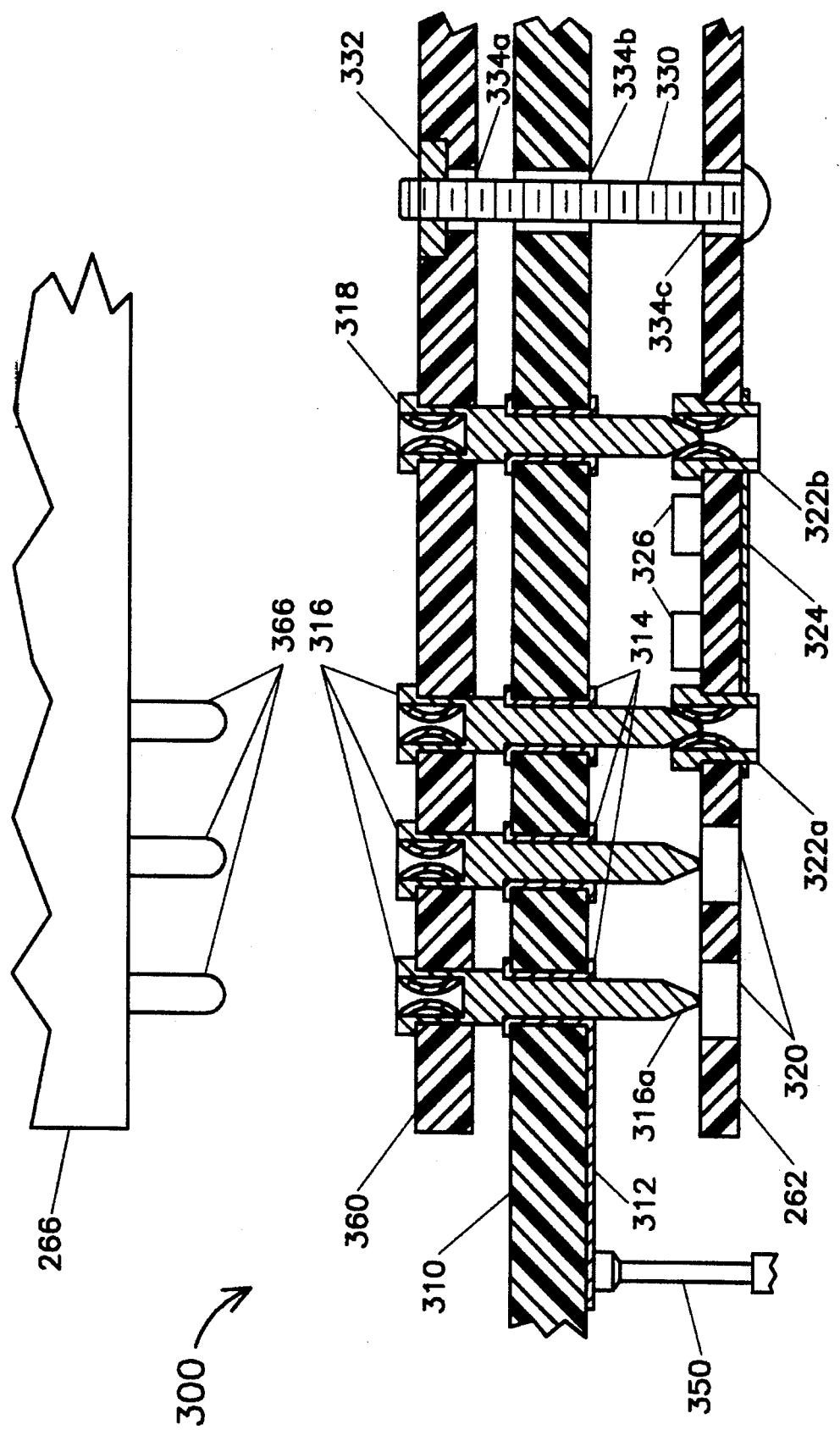
FIG. 3a is a cross-sectional view of a representative modified DUT board assembly, according to the invention.

FIG. 3a is a cross-sectional view of a DUT fixture assembly 300 comprising a DUT base board 310, a DUT test receptacle 360, a "bias" adapter board 262, and a DUT connector 266. In this FIG., it can be seen how the aforementioned signal and power supply connections are made between the ATE (e.g., 100, FIG. 1) and the "DUT connector 66. The test receptacle 360 is essentially a planar substrate (e.g., material such as, for example, non-conductive plastic fiberglass or the like) with a plurality of elongated "socket pins" 316 and 318 assembled to it. Each of the elongated pins 316 is disposed at a connection location on the base board.

The socket pins 316 and 318 have a socket (pin-receiving) portion (at the top of the pin, as viewed in the figure) at one end thereof and an elongated pin portion (extending downwards, as viewed in the FIG.). The socket pins (316, 318) are assembled to the test receptacle 360 such that the socket portion is accessible from one side thereof (top, as viewed in the figure) while the pin portions extend from an opposite side thereof. The length of the extending pin portions of the socket pins 316 and 318 is such that they will extend completely through holes 314 in the DUT base board 310. Conductive signal traces 312 (one representative trace shown) on the DUT base board are used to establish connections between the ATE and the socket pins. For example, a spring pin 350 in a test interface connector (e.g., 150, FIG. 1a) of an ATE tester makes contact with a signal trace 312 on the DUT base board 310, preferably by means of a pad (i.e., an enlarged area of the trace 312). The signal trace traverses the surface of the DUT base board 310 to a hole 314 through which a socket pin 316 extends. By any suitable means (e.g., a solder connection, press-fit connection, etc.) the socket pin connects electrically (and possible mechanically) to the signal trace 312. This causes the signal carried by the signal trace 312 to be accessible from below the DUT base board (via the pin portion of the socket pin 316) and above (via the socket portion of the socket pin 316). Pins 366 of the DUT connector 266 are plugged into the Socket portion of the socket pins 316 to complete connections between signals in the ATE test interface connector (via, e.g., spring contacts 350) and the DUT connector 266.

A number of socket pins 318 (one shown) are used to connect to the power supply signals generated by programmable voltage sources in the ATE in similar fashion (e.g., by spring contacts, signal traces on the DUT base board, etc.). In order to minimize illustrative clutter, this connection is not explicitly shown in the figure, but the connection technique is similar or identical to that described above for tester signals (see, e.g., spring contact 350). Unlike the socket pins 316, into which the DUT connector 266 plugs, the DUT connector 266 does not directly contact the power-supply carrying socket pins 318. (one of ordinary skill in the art will immediately recognize that the socket portion of these socket pins is not needed, and that a substitution can readily be made of simple pins for the socket pins 318. It is within the spirit and scope of the invention to do so.)

The bias adapter board 262 has a plurality of holes 320 formed therethrough. The holes are positioned to align with the positions of the pin portions of the socket pins (316, 318) extending through the DUT base board 310. At the location of holes 320 corresponding to the locations of the power supply connected socket pins 318, contactors 322b are inserted into the holes 320. Similar contactors 322a are inserted into holes 320 corresponding to the locations of socket pins 316 which connect to power supply pin positions in the DUT connector 266. Electrical connections (illustrated by a conductive trace 324 in the figure, but which may be soldered wire connections or any other suitable connection technique) connect the contactors 322a to the contactors 322b. At hole (320) locations where no contactor (322a or 322b) is installed, no electrical contact is made with the socket pins (316) at those locations. The contactors can be, for example, Augat HolTight (tm) connectors. One of ordinary skill in the art will understand that any suitable removable connection scheme may be employed herein.

The test receptacle 360 has a threaded nut 332 embedded into the top (as viewed in the figure) surface thereof and a clearance hole 334c through which a screw 330 is inserted and screwed into the nut. The screw 330 also passes through holes 334b and 334c through the DUT base board 310 and bias adapter card 262, respectively. The head of the screw contacts the bottom (as viewed in the figure) surface of the bias adapter card 262. The screw is tightened to hold the bias adapter card 262 to the assembly of the test receptacle 360 and the DUT base board 310.

Generally, according to the present invention, it is evident from the description contained hereinabove how a "standard" base board 310 can be customized for different power supply connections by use of individual bias boards 262. In this manner, the standard base board can be used and reused for a wide variety of DUTs, requiring only that new bias boards be fabricated for each pin configuration (new socket/ DUT connector patterns) of a given DUT. Customized test receptacles 360 may be required for each DUT connector pattern.

Figure 3B:
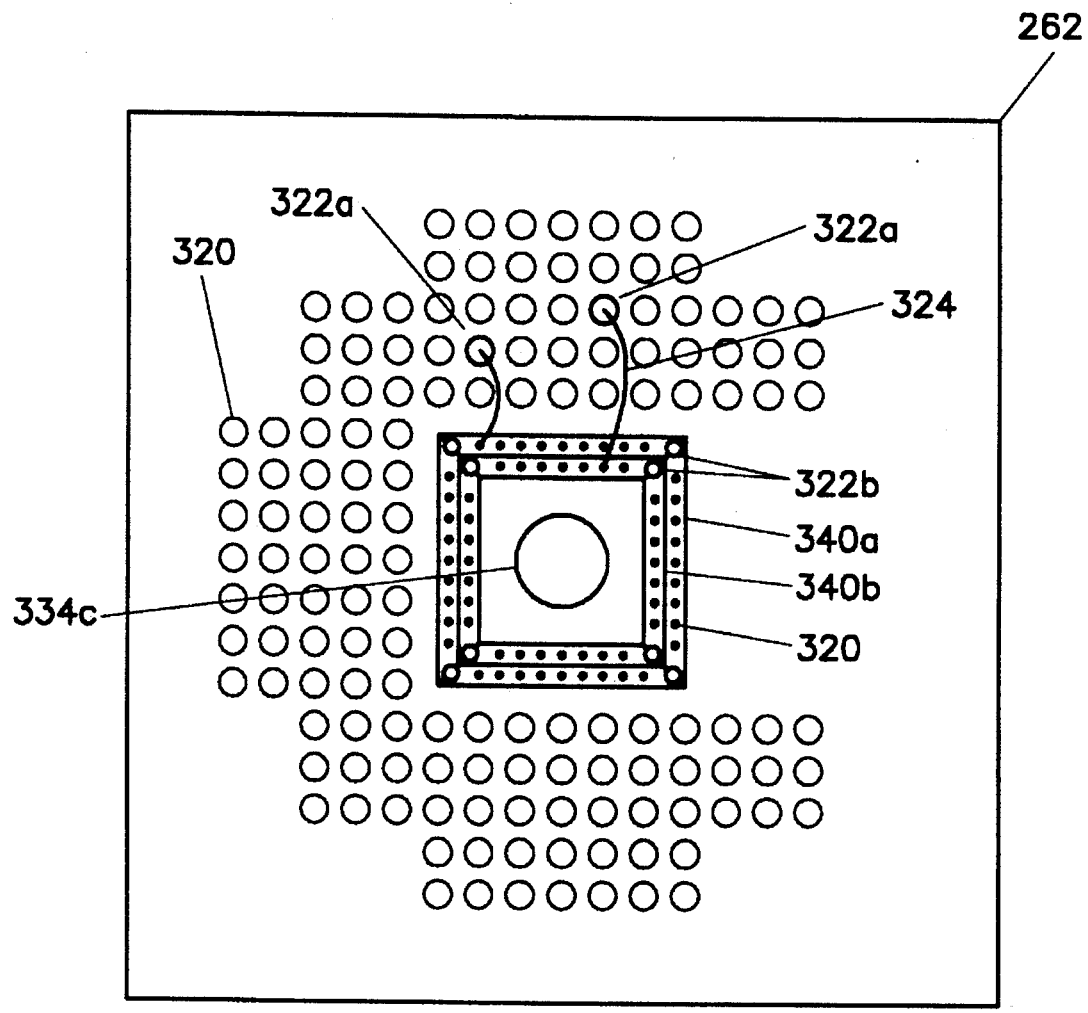
FIG. 3b is a top view of a representative "bias" board, according to the invention.

FIG. 3b is a top view of an embodiment of the bias adapter card (board) 262, showing a pattern of holes 320 disposed so as to align with the positions of socket pins (e.g., 316, 318) extending from the test receptacle (e.g., 360) through the DUT base board 310. The clearance hole 334a for the screw 330 is shown at the center of the bias adapter card 262. As illustrated, the DUT Connector 266 has an open center. In other words, the connector 266 has an array of pins (366), but no pins in a central area of the array. Accordingly, the design of the DUT arrangement 300 takes advantage of this by positioning the power supply carrying socket pins (318) at the center of the test receptacle 360. Four socket pins (318) are employed for each of two supply voltages. (e.g., ground and Vd). Those of ordinary skill in the art will immediately recognize that this scheme can be extended to accommodate any number of supply voltages.) Contactors 322a are installed in holes 320 (a representative two shown) corresponding to the positions of socket pins (316) which connect to designated power supply pins in the DUT socket 266. Contactors 322b are installed to connect to power supply carrying socket pins 318. In this case, four contactors 322b are used for each of the two supply voltages (corresponding to the number of socket pins 318 employed for this purpose). Conductive metal rings 340a and 340b connect the contactors 322b which are connected to like supply voltages. In this case, the conductive metal rings are formed concentrically. (No specific pattern is required, but rings are convenient for distribution of power). Electrical connections 324 (in this case, wires) are used to connect the power supply voltages, (from the conductive metal rings) to the appropriate contactors 322a.

The specific power supply connections for each different IC (DUT) is determined by the configuration of the installed bias board (e.g., 262). The bias board 262 essentially "programs" the power supply connections for the test fixture 300, conveying the supply voltages from a first portion (e.g., 318) of the plurality of elongated pins to another portion (e.g., 316) of the plurality of elongated pins. In this manner, virtually any power supply pin configuration can be accommodated by employing a properly configured bias adapter board. It is only necessary to provide as many different DUT base boards (including assembled test receptacle) as are necessary to accommodate all of the different DUT connectors to be employed. This number can be significantly fewer than the number of DUT connector types by virtue of the fact that more than one IC DUT can be accommodated by a single DUT base board. Storage requirements are thus minimized by eliminating the need for storing a custom designed DUT board for every IC type.

Further, each IC need only have a custom bias adapter board. These boards, which are considerably smaller and simpler than the prior art DUT boards, require little storage space, are relatively inexpensive, and can be assembled from a relatively small number of common blank boards. The commonality between bias adapter boards is defined by the number of different test receptacle DUT connector pin patterns which must be accommodated.

Those of ordinary skill in the art will immediately understand the desirability of providing decoupling capacitors (326) on each of the power supply pins. Such capacitors may readily be added to the bias board. It is within the spirit and scope of the present invention to do so. It will further be recognized by those of ordinary skill in the art that inexpensive, custom bias adapter cards (boards) can readily be designed wherein the connections between the power supply carrying receptacle pins and socket pins connected to power supply pins of the DUT are accomplished by conductive traces on the bias adapter board, especially where so-called "micro-strip" traces are employed. These traces can also be routed to conductive pads to which surface-mounted decoupling capacitors are assembled.

The bias board provides an easy, inexpensive method to provide power and ground connections to a device under test (DUT) using automatic test equipment. For example, when personalizing, or "programming" a bias board, a customer specification would be reviewed to determine where power supply connections are needed. The bias board is wired and decoupling capacitors are added (as desired) for all power connections. HolTights are then installed at the location of each biased pin. The bias board is then mounted to the base board, by the fastening means (e.g., screw 330, nut 332) described hereinabove, or the like. By employing a relatively simple bias adapter scheme, potential delays are avoided in the anode cycle, since no elaborate fabrication techniques initially are required to adapt an existing DUT fixture to a new IC. Only a new bias adapter card is required.

Although the DUT fixture 300 is described above with respect to a specific mechanical configuration, one of ordinary skill in the art will immediately recognize that the technique is readily adaptable to a variety of different ATE test interface connection schemes. Further, the specific arrangement of test receptacle, DUT baseboard, and bias adapter card described herein is not intended to be restrictive. Any technique which uses a bias adapter to connect between power supply connections and DUT connector pins independent of the DUT base board may be employed, regardless of the specific pin/socket/contactor arrangement which is employed. It is within the spirit and scope of the present invention to do so.

The above, and other objects, features, advantages and embodiments of the invention, including other (i. e., additional) embodiments of the techniques discussed above may become apparent to one having ordinary skill in the art to which this invention most nearly pertains, and such other and additional embodiments are deemed to be within the spirit and scope of the present invention.

What is claimed is:

1. A generic test fixture having a removable biasing board, said generic test fixture adapted for connection to automated testing equipment for the testing of integrated circuits, said test fixture comprising:

a base board having means for connection to an integrated circuit automated test system and having a plurality of first connection receptacles, said connection means connected to said plurality of first connection receptacles, said plurality of first connection receptacles adapted to receive and connect to connection pins inserted therein;

device-under-test (DUT) socket adapted to receive an integrated circuit to be tested, said DUT socket having connection pins adapted to be inserted into said plurality of first connection receptacles of said base board, thereby connecting the integrated circuit to be tested to the automated test system;

said DUT socket connection pins passing through said plurality of first connection receptacles and protruding away from a face of said base board opposite said DUT socket; and a biasing board having a plurality of second connection receptacles with selected connections therebetween, said plurality of second connection receptacles adapted for connection to certain ones of said DUT socket connection pins, wherein the certain ones of said DUT socket connection pins are connected together and through certain ones of said connection means of said base board to a source of power from the automated test system.

2. A test fixture, according to claim 1, wherein:

said connection means includes traces on a surface of the base board.

3. A test fixture, according to claim 1, wherein:

said biasing board is removably installed to said base board.

4. A test fixture, according to claim 1, wherein:

said biasing board is for a specific integrated circuit which corresponds to the integrated circuit to be tested.

5. A test fixture, according to claim 1, further comprising:

one or more decoupling capacitors connected on said biasing board.

6. A test fixture, according to claim 1, wherein said biasing board removably installed to said base board and connected thereto by said DUT socket connection pins.

7. A test fixture, according to claim 1, further comprising:

a threaded nut embedded into said DUT socket wherein:
  said biasing board is secured to the DUT socket pins by means of a screw extending through said biasing board, through said base board, and into the threaded nut in said DUT socket.

* * * * *